(12) United States Patent
Chun et al.

(10) Patent No.: US 8,227,149 B2
(45) Date of Patent: Jul. 24, 2012

(54) MASKS AND METHODS OF FORMING THE SAME

(75) Inventors: YongJin Chun, Daejeon (KR); Soohan Choi, Seoul (KR); Sangwook Kim, Yongin-si (KR); Seongwoon Choi, Suwon-si (KR); Sukjoo Lee, Yongin-si (KR); Sungwoo Lee, Suwon-si (KR); Youngchang Kim, Seoul (KR); SungSoo Suh, Yongin-si (KR); Jin-sun Choi, Gimpo-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 233 days.

(21) Appl. No.: 12/656,881

(22) Filed: Feb. 18, 2010

(65) Prior Publication Data
US 2010/0216063 A1    Aug. 26, 2010

(30) Foreign Application Priority Data

Feb. 20, 2009    (KR) .................. 10-2009-0014451

(51) Int. Cl.
*G03F 1/70* (2012.01)
(52) U.S. Cl. ......................................... 430/5
(58) Field of Classification Search ............. 430/5, 311, 430/394; 716/50–56
See application file for complete search history.

(56) References Cited

U.S. PATENT DOCUMENTS 7,506,299 B2 *   3/2009   Socha et al. .................. 716/132
7,721,247 B2 *   5/2010   Wu ................................ 716/50

FOREIGN PATENT DOCUMENTS

| JP | 2001-337440 | 12/2001 |
| KR | 10-2003-0000825 | 1/2003 |
| KR | 10-2005-0062409 | 6/2005 |
| KR | 10-2008-0020227 | 3/2008 |

* cited by examiner

*Primary Examiner* — Stephen Rosasco
(74) *Attorney, Agent, or Firm* — Harness, Dickey & Pierce, P.L.C.

(57) ABSTRACT

Methods of forming masks. According to the methods, a target pattern is set. Generation of a side lobe caused by the target pattern is verified. A preliminary target pattern and a preliminary side lobe pattern are set, in the target pattern and a region where the side lobe is generated, respectively. An interference pattern map using the preliminary target pattern and the preliminary side lobe pattern is created. At least one of regions having a phase identical or opposite to that of a position of the preliminary target pattern in the interference pattern map is set to an interference auxiliary pattern. A mask using the interference auxiliary pattern and the target pattern is formed.

16 Claims, 9 Drawing Sheets

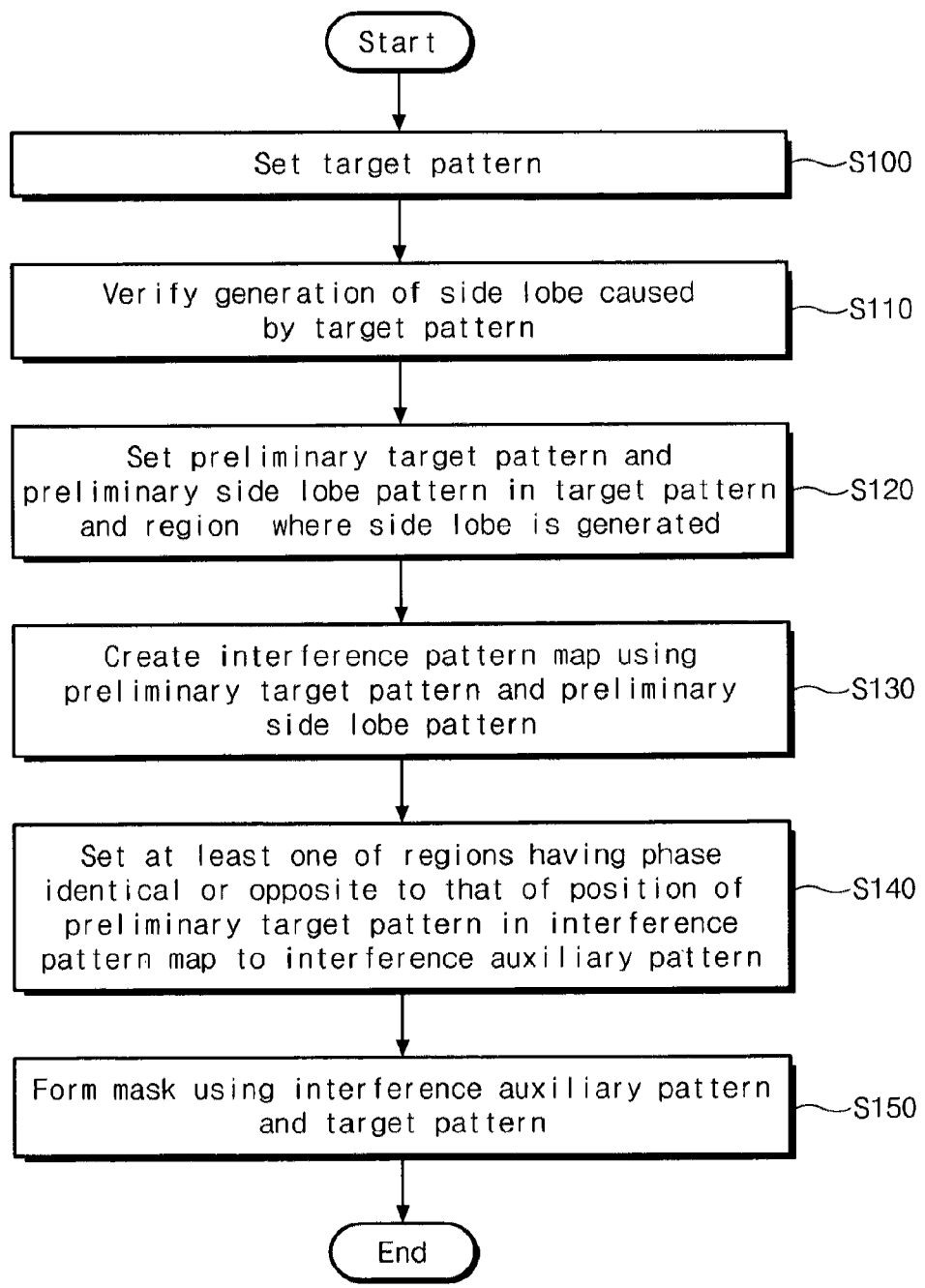

MASKS AND METHODS OF FORMING THE SAME

CROSS-REFERENCE TO RELATED APPLICATIONS

This U.S. non-provisional patent application claims priority under 35 U.S.C. §119 to Korean Patent Application No. 10-2009-0014451, filed on Feb. 20, 2009, in the Korean Intellectual Property Office (KIPO), the entire contents of which is incorporated herein by reference.

BACKGROUND

1. Field

The present disclosure relates to masks, and more particularly, to a side lobe inhibiting masks.

2. Description of the Related Art

A photolithography process may be used for patterning a semiconductor device. The photolithography process may be performed by radiating light onto a mask having a main pattern formed thereon. Light passing through the mask may expose a photoresist film to form a photoresist pattern. An unexpected side lobe may be generated in the photoresist pattern due to interference of light diffracted by the mask target pattern. If a side lobe removal pattern is disposed on a position of the mask corresponding to a position where the side lobe is generated, destructive interference between the target pattern and the side lobe removal pattern may remove the side lobe. However, the side lobe removal pattern may cause a reduction in light intensity at a lower part of the target pattern and a lithography process margin may be reduced. An auxiliary interference pattern inhibiting side lobe formation without reducing light intensity at a lower part of the target pattern may be required.

SUMMARY

Example embodiments of the inventive concepts provide methods of forming masks using interference pattern maps and masks formed by using interference pattern maps.

Example embodiments of the inventive concepts provide methods of forming a mask including setting a preliminary target pattern corresponding to a target pattern, setting a preliminary side lobe pattern in a region corresponding to a position where a side lobe is generated by the target pattern, creating an interference pattern map using the preliminary target pattern and the preliminary side lobe pattern, setting an interference auxiliary pattern corresponding to at least one region of the interference pattern map, the at least one region of the interference pattern map having a phase about one of identical and opposite to that of a position of the interference pattern map corresponding to the preliminary target pattern, and forming a mask including the interference auxiliary pattern and the target pattern.

Example embodiments of the inventive concepts provide methods of forming a mask including: setting a target pattern; verifying generation of a side lobe caused by the target pattern; setting a preliminary target pattern and a preliminary side lobe pattern in the target pattern and a region where the side lobe is generated; creating an interference pattern map using the preliminary target pattern and the preliminary side lobe pattern; setting at least one of regions having a phase identical or opposite to that of a position of the preliminary target pattern in the interference pattern map to an interference auxiliary pattern; and forming a mask using the interference auxiliary pattern and the target pattern.

According to example embodiments, the side lobe may have a phase difference of about 180 degrees from the target pattern, and the interference auxiliary pattern may have the same phase as the target pattern. The side lobe may have a phase difference of about 0 degrees from the target pattern, and the interference auxiliary pattern may have a phase difference of about 180 degrees from the target pattern. The forming the mask using the interference auxiliary pattern and the target pattern may further include a side lobe auxiliary pattern at a position where the side lobe is generated. The preliminary target pattern and the preliminary side lobe pattern may have smaller sizes than sizes of the target pattern and the side lobe, respectively. The preliminary target pattern and the preliminary side lobe pattern may have smaller sizes than a wavelength used in an exposure. The forming the mask using the interference auxiliary pattern and the target pattern may further include performing an Optical Proximity Correction (OPC) process.

According to example embodiments, a mask may be formed by setting a target pattern; verifying generation of a side lobe caused by the target pattern; setting a preliminary target pattern and a preliminary side lobe pattern in the target pattern and a region where the side lobe is generated; creating an interference pattern map using the preliminary target pattern and the preliminary side lobe pattern; setting at least one of regions having a phase identical or opposite to that of a position of the preliminary target pattern in the interference pattern map to an interference auxiliary pattern; and forming a mask using the interference auxiliary pattern and the target pattern.

BRIEF DESCRIPTION OF THE DRAWINGS

Example embodiments will be more clearly understood from the following brief description taken in conjunction with the accompanying drawings. FIGS. 1-5D represent non-limiting, example embodiments as described herein.

FIG. 1 is a flowchart illustrating methods of forming masks according to example embodiments of the inventive concepts;

FIGS. 5A-5D are diagrams illustrating methods of forming masks according to example embodiments of the inventive concepts.

Figure 2A:
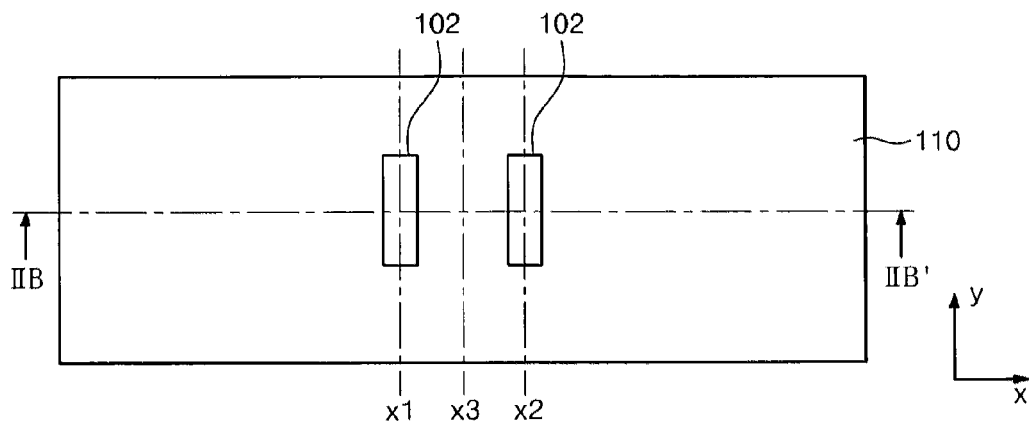
FIGS. 2A-2D are diagrams illustrating methods of forming masks according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments of the inventive concepts will be described below in more detail with reference to the accompanying drawings. The inventive concepts may, however, be embodied in different forms and should not be construed as limited to the example embodiments set forth herein. Rather, these example embodiments are provided so that this disclosure will be thorough and complete, and will fully convey the scope of the inventive concepts to those skilled in the art.

In the drawings, the dimensions of layers and regions are exaggerated for clarity of illustration. It will be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes", and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the inventive concepts:

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a flowchart illustrating methods of forming masks according to example embodiments of the inventive concepts. Referring to FIG. 1, methods of forming masks may include setting a target pattern in operation S100, verifying generation of a side lobe caused by the target pattern in operation S110, setting a preliminary target pattern and a preliminary side lobe pattern, in the target pattern and a region where the side lobe is generated, respectively, in operation S120, creating an interference pattern map using the preliminary target pattern and the preliminary side lobe pattern in operation S130, setting at least one of regions having a phase identical or opposite to that of a position of the preliminary target pattern in the interference pattern map to an interference auxiliary pattern in operation S140, and forming a mask using the interference auxiliary pattern and the target pattern in operation S150.

Figure 2B:
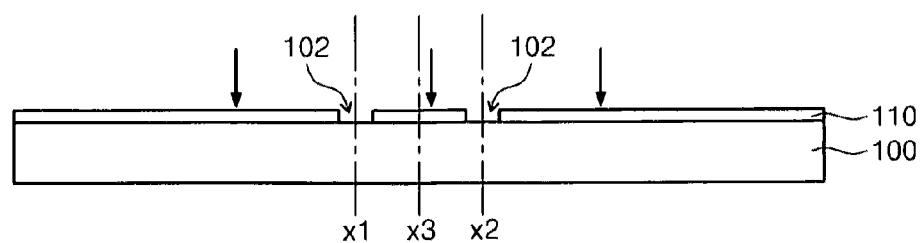
Figure 2C:
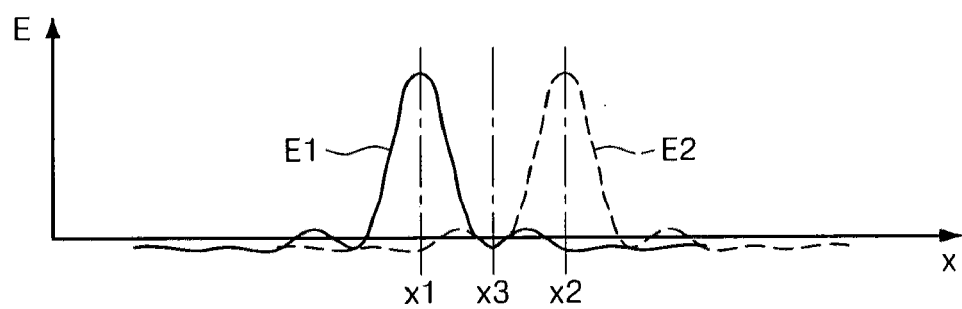
Figure 2D:
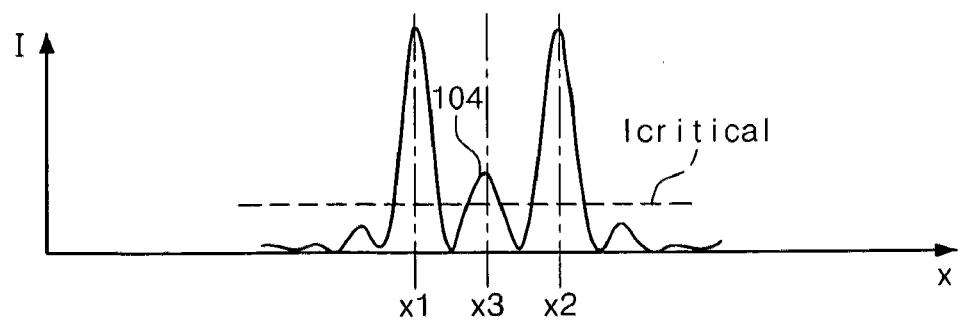

FIGS. 2A-2D are diagrams illustrating the setting of the target pattern in operation S100 of FIG. 1 and the verifying of the generation of the side lobe caused by the target pattern in operation S110 of FIG. 1 according to methods of forming masks of example embodiments. FIG. 2A is a diagram illustrating a mask including a target pattern. FIG. 2B is a cross-sectional view taken along line IIB-IIB' of the mask of FIG. 2A. FIG. 2C shows a spatial distribution of an electric field formed at a lower part of the target pattern of FIG. 2B. FIG. 2D shows a spatial distribution of light intensity formed at a lower part of the target pattern of FIG. 2B.

Referring to FIGS. 2A-2D, a mask layer 110 may be disposed on a substrate 100. In operation S100 of FIG. 1, the mask layer 110 may be patterned to form target pattern 102. The mask layer 110 may include, for example, Cr. The substrate 100 may be, for example, a quartz substrate. The mask layer 110 may have, for example, a multi-layered structure.

The target pattern 102 may have, for example, a line, slit, and/or hole shape. The shape of the target pattern 102 may be varied. A plurality of target patterns 102 may be provided. The plurality of target patterns 102 may be disposed, for example, adjacent to each other. When light is radiated onto the target patterns 102 that are adjacent to each other on the substrate 100, target interference patterns E1, E2 may be formed at lower parts of the target patterns 102. The target interference patterns E1 and E2 may be electric field diffraction patterns of the target patterns 102, and may overlap each other.

Electric fields of respective centers x1 and x2 of the target interference patterns E1 and E2 may have a phase of about 0 degree. An electric field of the central region x3 between the target interference patterns E1 and E2 may have a phase of about 180 degrees. If light intensity I of the target interference patterns E1, E2 is greater than a critical intensity Icritical, the light may cause a chemical reaction in a photoresist and form a pattern (e.g., latent image). If the light intensity I of the target interference patterns E1, E2 is greater than the critical intensity Icritical in an undesired region, a side lobe 104 may be formed in the photoresist (not shown) in operation S110 of FIG. 1.

The setting of the target pattern in operation S100 of FIG. 1 and the verifying of the generation of the side lobe caused by the target pattern in operation S110 of FIG. 1 may be performed through, for example, a computer simulation.

Figure 3A:
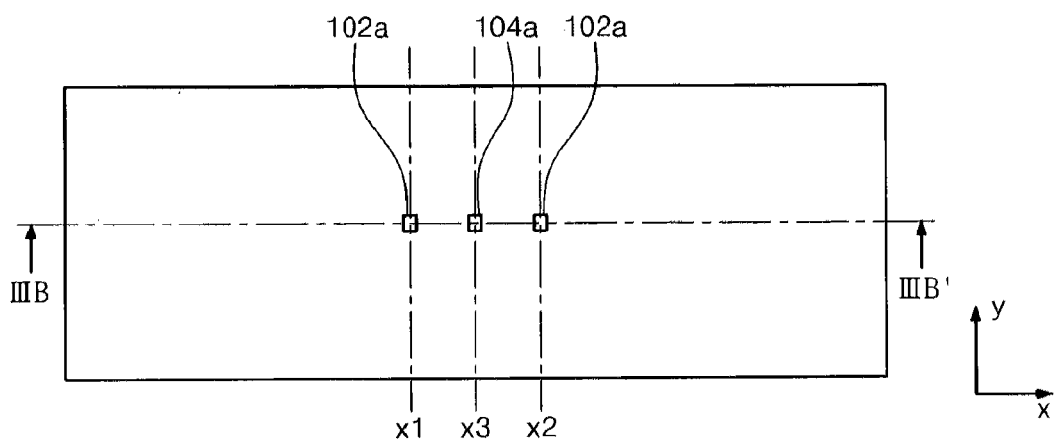
FIGS. 3A-3C are diagrams illustrating methods of forming masks according to example embodiments of the inventive concepts.
Figure 3B:
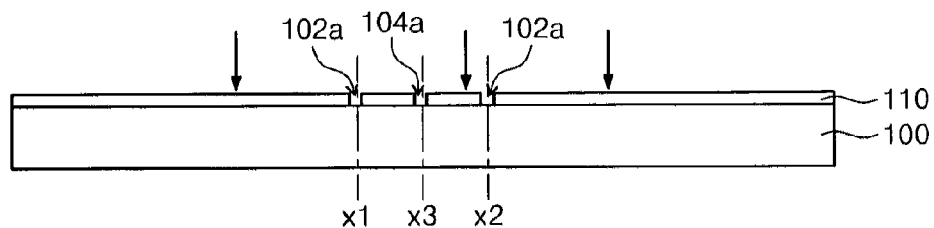
Figure 3C:
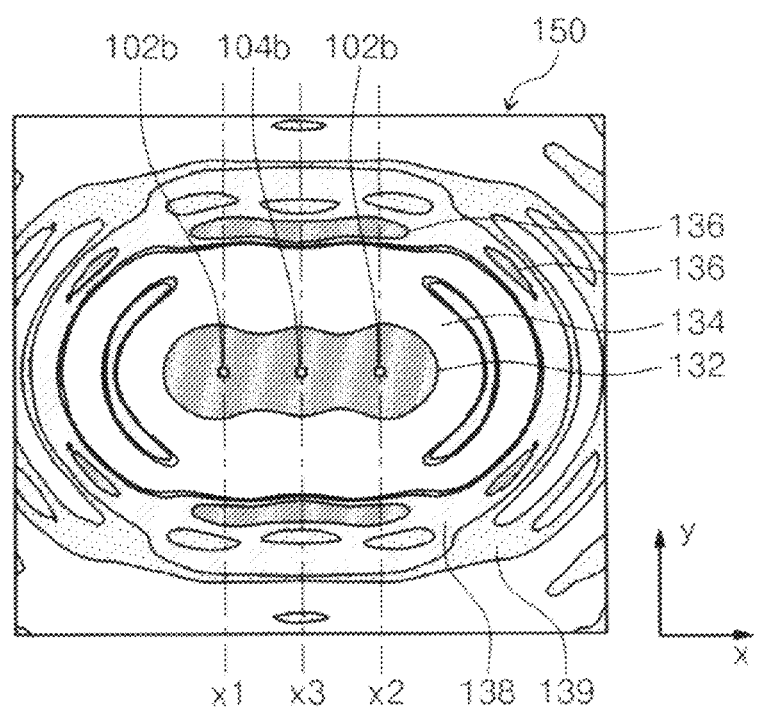

FIGS. 3A-3D are diagrams illustrating the setting of a preliminary target pattern and a preliminary side lobe pattern, in the target pattern and the region where the side lobe is generated, respectively, in operation S120 of FIG. 1, and the creation of an interference pattern map using the preliminary target pattern and the preliminary side lobe pattern in operation S130 of FIG. 1, according to methods of forming masks of example embodiments. FIG. 3A is a diagram illustrating a mask including a target pattern having a preliminary target pattern and a preliminary side lobe pattern. FIG. 3B is a cross-sectional view taken along line IIIB-IIIB' of FIG. 3A. FIG. 3C shows an interference pattern map of an electric field formed at a lower part of the target pattern of FIG. 3A.

Referring to FIGS. 2A-3C, in operation 5120 of FIG. 1, a preliminary target pattern 102a may be set corresponding to the target pattern 102, and a preliminary side lobe pattern 104a may be set in a region corresponding to the side lobe 104. The size of the preliminary target pattern 102a may be less than the size of the target pattern 102. The size of the preliminary side lobe pattern 104a may be less than the size of a region where the side lobe 104 is generated. The sizes of the preliminary target pattern 102a and the preliminary side lobe pattern 104a may be less than a wavelength used in an exposure, respectively. For example, the sizes of the preliminary target pattern 102a and the preliminary side lobe pattern 104a may be less than about one-tenth of a wavelength used in an exposure.

In operation S130 of FIG. 1, an electric field interference pattern map 150 may be created using the preliminary target pattern 102a and the preliminary side lobe pattern 104a. The interference pattern map 150 may be generated by, for example, a computer simulation. The interference pattern map 150 may be a contour map connecting regions having the same phase.

A virtual preliminary target pattern 102b and a virtual preliminary side lobe pattern 104b may be shown in the interference pattern map 150. The virtual preliminary target pattern 102b may be formed by projecting the preliminary target pattern 102a on the interference pattern map 150. The virtual preliminary side lobe pattern 104b may be formed by projecting the preliminary side lobe pattern 104a on the interference pattern map 150.

In the interference map 150, a first region 132 having a peanut shape may include a region in which the virtual preliminary target pattern 102b and the virtual preliminary side lobe pattern 104b are disposed. The phase of the first region 132 may be about 0 degrees. The outer region adjacent to the first region 132 may be a second region 134 having a phase of about 180 degrees. A third region 136 having a phase of about 0 degrees may be disposed outside the second region. If a hole pattern is formed in a region of the mask corresponding to the third region 136, the third region 136 may cause constructive interference in the first region 132 having a phase of about 0 degrees. A pattern of the mask corresponding to the third region 136 may constitute an interference auxiliary pattern inhibiting generation of a side lobe. A fourth region 138 and a fifth region 139 disposed around the first region 132 may have one of phases between about 0 degree and about 180 degrees.

Figure 4A:
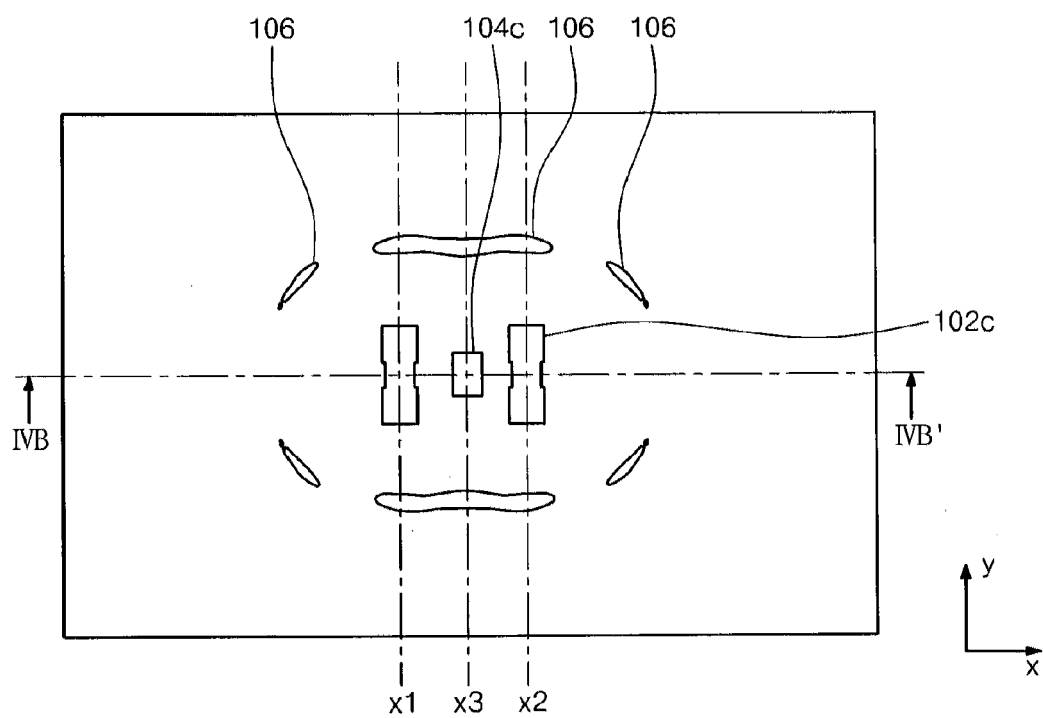
FIGS. 4A-4C are diagrams illustrating methods of forming masks according to example embodiments of the inventive concepts.
Figure 4B:
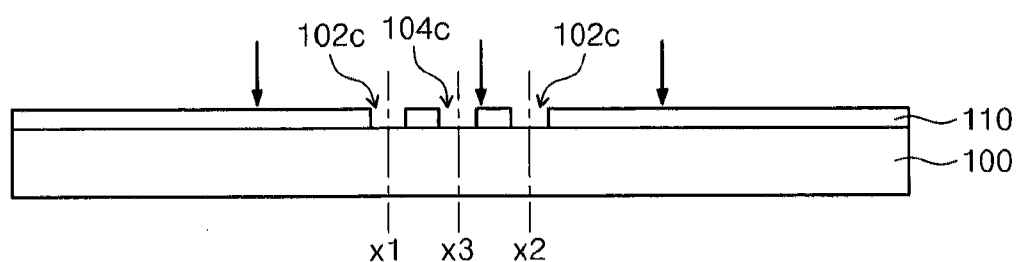
Figure 4C:
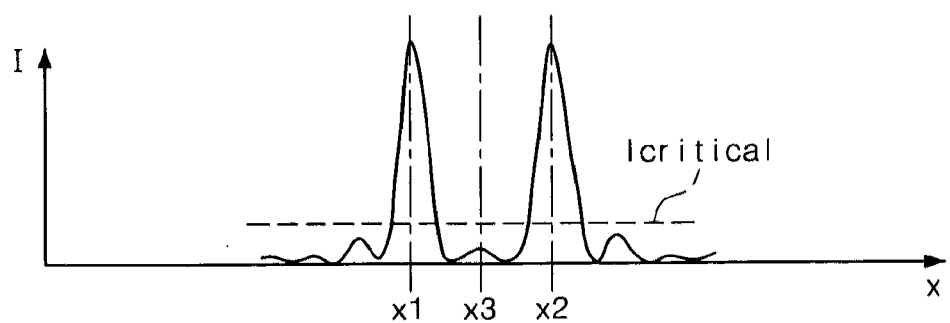

FIGS. 4A-4D are diagrams illustrating the setting of the at least one of the regions having the phase identical or opposite to that of the position of the preliminary target pattern in the interference pattern map to the interference auxiliary pattern in operation S140 of FIG. 1, and the forming of the mask using the interference auxiliary pattern and the target pattern in operation 5150 of FIG. 1, according to methods of forming masks of example embodiments. FIG. 4A is a diagram illustrating a mask including a target pattern and an interference auxiliary pattern. FIG. 4B is a cross-sectional view taken along line IVB-IVB' of FIG. 4A. FIG. 4C shows a light intensity formed at a lower part of the target pattern of FIG. 4B.

Referring to FIGS. 4A-4C, a mask layer 110 may be disposed on a substrate 100. In operation S150 of FIG. 1, the mask layer may be patterned to form a target pattern 102c and an interference auxiliary pattern 106. In operation 5140 of FIG. 1, the shape of the interference auxiliary pattern 106 may be obtained using an interference pattern map 150 of FIG. 3C formed by a preliminary target pattern 102a of FIGS. 3A and 3B and a preliminary side lobe pattern 104a of FIGS. 3A and 3B.

The target pattern 102c may have, for example, a line, slit, and/or hole shape. The mask layer 110 may be formed of, for example, a conductive metal. The mask layer 110 may include, for example, Cr. The substrate 100 may be, for example, a quartz substrate. An Optical Proximity Correction (OPC) may be performed on the target pattern 102c.

A plurality of target patterns 102c may be provided. The target patterns 102c may be, for example, disposed adjacent to each other. When an exposure is performed on an upper part of the substrate 100, an interference pattern may be formed at lower parts of the target patterns 102c and the interference auxiliary patterns 106. The interference auxiliary patterns 106 may be provided to cause a constructive interference at positions of the target patterns 102c and cause a destructive interference at a position where a side lobe is formed. Icritical may not be reached in the central region x3 corresponding to the side lobe.

According to at least one example embodiment, a side lobe auxiliary pattern 104c may be disposed at a position of the mask corresponding to the position where the side lobe is formed. The generation of a side lobe may be further inhibited over a case where the target patterns 102c and the interference auxiliary patterns 106 are used without the side lobe auxiliary pattern 104c.

Figure 5A:
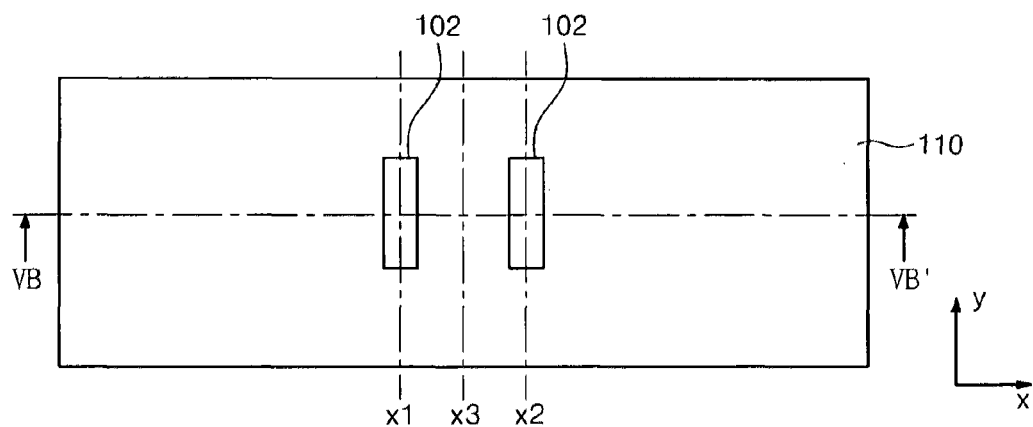
Figure 5B:
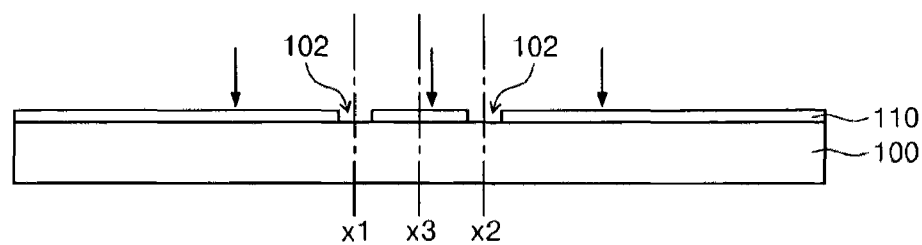
Figure 5C:
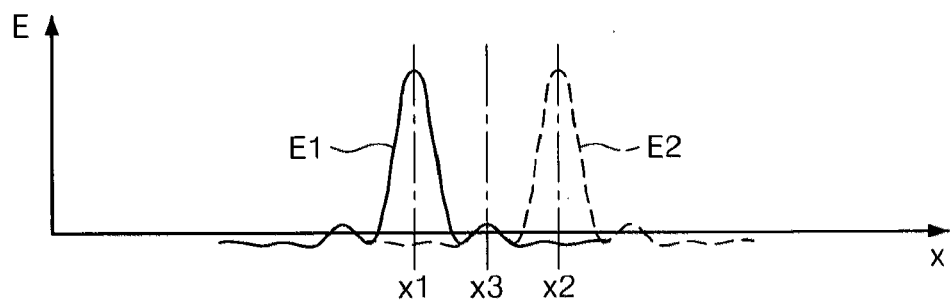
Figure 5D:
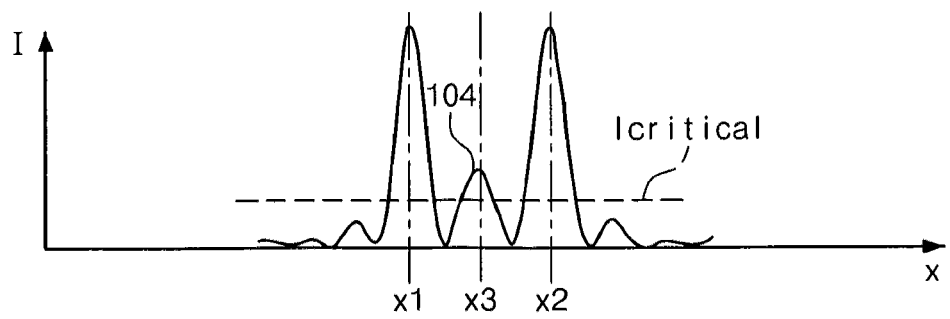

FIGS. 5A-5D are diagrams illustrating methods of forming masks according to example embodiments of the inventive concepts. FIG. 5A is a diagram illustrating a mask including a target pattern. FIG. 5B is a cross-sectional view taken along line VB-VB' of FIG. 5A. FIG. 5C shows an electric field spatial distribution formed at a lower part of the target pattern of FIG. 5B. FIG. 5D shows a spatial distribution of light intensity formed at the lower part of the target pattern of FIG. 5B.

Referring to FIGS. 5A-5D, a mask layer 110 may be disposed on a substrate 100. The mask layer 110 may be patterned to form target pattern 102. The mask layer 110 may include, for example, Cr. The substrate 100 may be, for example, a quartz substrate. The mask layer 110 may have, for example, a multi-layered structure.

The target pattern 102 may have, for example, a line, slit, and/or hole shape. The shape of the target pattern 102 may be varied. A plurality of target patterns 102 may be provided. The plurality of target patterns 102 may be, for example, disposed adjacent to each other. When light is radiated onto the target patterns 102 that are disposed adjacent to each other on the substrate 100, target interference patterns E1, E2 may be formed at lower parts of the target patterns 102. The target interference patterns E1 and E2 may be respective electric field diffraction patterns of the target patterns 102, and may overlap each other.

Electric fields of respective centers x1 and x2 of the target interference patterns E1 and E2 may have a phase of about 0 degrees. An electric field of the central region x3 between the target interference patterns E1 and E2 may have a phase of about 0 degrees. If light intensity I of the target interference patterns E1, E2 is greater than a critical intensity Icritical, the light may cause a chemical reaction in a photoresist and form a pattern. If the light intensity I of the target interference patterns E1, E2 is greater than the critical intensity Icritical in an undesired region, a side lobe 104 may be formed in the photoresist (not shown).

As described in FIGS. 3A-4D, an interference pattern map may be created using a preliminary side lobe pattern and a preliminary target pattern disposed at a position where a side lobe is generated. By using the interference pattern map, an interference auxiliary pattern may be selected to cause a destructive interference on a region where the side lobe is disposed. A mask may be formed using the interference auxiliary pattern and the target pattern.

Masks according to example embodiments of the inventive concepts may inhibit a side lobe from being generated and a process margin of a photolithography process may be improved.

While example embodiments have been particularly shown and described, it will be understood by one of ordinary skill in the art that variations in form and detail may be made therein without departing from the spirit and scope of the claims. The above-disclosed subject matter is to be considered illustrative and not restrictive. The appended claims are intended to cover all such modifications, enhancements, and other embodiments which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A method of forming a mask, comprising:
    setting a preliminary target pattern corresponding to a target pattern;
    setting a preliminary side lobe pattern in a region corresponding to a position where a side lobe is generated by the target pattern;
    creating an interference pattern map using the preliminary target pattern and the preliminary side lobe pattern;
    setting an interference auxiliary pattern corresponding to at least one region of the interference pattern map, the at least one region of the interference pattern map having a phase one of about identical and opposite to that of a position of the interference pattern map corresponding to the preliminary target pattern; and
    forming a mask including the interference auxiliary pattern and the target pattern.

2. The method of claim 1, further comprising:
    setting the target pattern; and
    verifying generation of the side lobe by the target pattern.

3. The method of claim 2, wherein at least one of the verifying of the generation of the side lobe and the creation of the interference map is performed by simulation.

4. The method of claim 1, wherein light from the target pattern falling on the position where the side lobe is generated has a phase difference of about 180 degrees from light from the target pattern falling on a position where a pattern of the target pattern is generated, and
    the forming of the mask includes forming the mask such that light from the interference auxiliary pattern at the position where the pattern of the target pattern is generated constructively interferes with light from the target pattern at the position where the pattern of the target pattern is generated.

5. The method of claim 4, wherein the constructively interfering light has about the same phase.

6. The method of claim 1, wherein light from the target pattern falling on the position where the side lobe is generated has a phase difference of about 0 degrees from light from the target pattern falling on a position where a pattern of the target pattern is generated, and
    the forming of the mask includes forming the mask such that light from the interference auxiliary pattern at the position where the pattern of the target pattern is generated destructively interferes with light from the target pattern at the position where the pattern of the target pattern is generated.

7. The method of claim 6, wherein the destructively interfering light has a phase difference of about 180 degrees.

8. The method of claim 1, wherein the forming of the mask including the interference auxiliary pattern and the target pattern further includes forming a side lobe auxiliary pattern at a position corresponding to where the side lobe is generated.

9. The method of claim 1, wherein the preliminary target pattern has a smaller size than the target pattern, and
    the preliminary side lobe pattern has a smaller size than the side lobe.

10. The method of claim 1, wherein dimensions of the preliminary target pattern and the preliminary side lobe pattern are sized to be smaller than a wavelength used in a lithography process including the mask.

11. The method of claim 10, wherein the dimensions are sized to be less than about 1/10 of the wavelength.

12. The method of claim 1, wherein the forming of the mask including the interference auxiliary pattern and the target pattern further includes performing an Optical Proximity Correction (OPC) process.

13. The method of claim 1, wherein the interference auxiliary pattern is a hole pattern.

14. Then method of claim 1, wherein the interference auxiliary pattern is shaped according to the at least one region of the interference pattern map.

15. A mask formed by the method of claim 1.

16. The mask of claim 15, wherein the interference auxiliary pattern is configured to destructively interfere with diffracted light at the position where the side lobe is generated and constructively interfere with light at a position where a pattern of the target pattern is generated.

* * * * *